United States Patent
Hou

(10) Patent No.: US 8,482,351 B2
(45) Date of Patent: Jul. 9, 2013

(54) POWER AMPLIFIER AND METHOD FOR AMPLIFYING SIGNAL BASED ON POWER AMPLIFIER

(75) Inventor: Zhaozheng Hou, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/531,773

(22) Filed: Jun. 25, 2012

(65) Prior Publication Data

US 2012/0299654 A1 Nov. 29, 2012

Related U.S. Application Data

(63) Continuation of application No. PCT/CN2010/078136, filed on Oct. 27, 2010.

(30) Foreign Application Priority Data

May 6, 2010 (CN) .......................... 2010 1 0164401

(51) Int. Cl.
  *H03F 3/45* (2006.01)
(52) U.S. Cl.
  USPC ........................................................ 330/255
(58) Field of Classification Search
  USPC .................................................. 330/251, 255
  See application file for complete search history.

(56) References Cited

U.S. PATENT DOCUMENTS

| | | | |
|---|---|---|---|
| 5,815,040 A | 9/1998 | Barbetta | |
| 7,061,313 B2 * | 6/2006 | Kimball et al. | 330/103 |
| 7,403,068 B2 * | 7/2008 | Zhou | 330/103 |
| 2003/0137344 A1 | 7/2003 | Kimball et al. | |
| 2004/0135627 A1 | 7/2004 | Yamazato et al. | |
| 2005/0162223 A1 | 7/2005 | Maejima | |
| 2007/0290969 A1 | 12/2007 | Hsu | |

FOREIGN PATENT DOCUMENTS

| | | |
|---|---|---|
| CN | 1729619 | 2/2006 |
| CN | 1741371 | 3/2006 |
| CN | 1925316 | 3/2007 |
| CN | 101127508 | 2/2008 |
| CN | 101826844 | 9/2010 |
| EP | 1811652 | 7/2007 |
| JP | 2004-282544 | 10/2004 |

OTHER PUBLICATIONS

English language International Search Report from the State Intellectual Property Office of P.R. China for International Application No. PCT/CN2010/078136 mailed Feb. 17, 2011.

(Continued)

*Primary Examiner* — Robert Pascal
*Assistant Examiner* — Khiem Nguyen
(74) *Attorney, Agent, or Firm* — Staas & Halsey LLP

(57) ABSTRACT

A power amplifier for amplifying a signal includes: an operation amplifier stage, at least one buffer stage and an output stage which are consecutively connected with each other; a first feedback unit connected between an output end of the output stage and a negative input end of the operation amplifier stage; a second feedback unit connected between an input end of the output stage and the negative input end of the operation amplifier stage; a third feedback unit connected between an input end of the at least one buffer stage and the negative input end of the operation amplifier stage; and feedback signals provided by the first feedback unit, the second feedback unit and the third feedback unit being superposed at the negative input end of the operation amplifier stage.

8 Claims, 3 Drawing Sheets

OTHER PUBLICATIONS

English language partial translation of First Chinese Office Action of Chinese Application No. 201010164401.2 mailed Sep. 7, 2011.

Alfio Dario Grasso et al., "Advances in Reversed Nested Miller Compensation", IEEE Transactions on Circuits and Systems, vol. 54, No. 7, Jul. 2007, pp. 1459-1470.

International Search Report issued Feb. 17, 2011 in corresponding International Patent Application No. PCT/CN2010/078136.

Extended European Search Report issued Oct. 5, 2012 in corresponding European Patent Application No. 10851004.1.

English Translation of the PCT Written Opinion Mailed Feb. 17, 2011 in corresponding International Patent Application No. PCT/CN2010/078136 (5 pages).

* cited by examiner

POWER AMPLIFIER AND METHOD FOR AMPLIFYING SIGNAL BASED ON POWER AMPLIFIER

CROSS-REFERENCE TO RELATED APPLICATIONS

This application is a continuation of International Application No. PCT/CN2010/078136, filed on Oct. 27, 2010, which claims priority to Chinese Patent Application No. 201010164401.2, filed on May 6, 2010, both of which are hereby incorporated by reference in their entireties.

FIELD OF THE INVENTION

The present invention relates to the field of electronics technology, and in particular, to a power amplifier and a method for amplifying a signal based on a power amplifier.

BACKGROUND OF THE INVENTION

A current wireless communication system, such as a code division multiple access system and a wideband code division multiple access system, generally adopts a variable envelope modulation technique to perform amplitude modulation and phase modulation. In the variable envelope modulation technique, a power amplifier is required to perform signal amplification, and this kind of modulation technique enables an envelope signal to have a wider dynamic range, and bandwidth often reaches more than dozens of megahertz (MHz); therefore, high requirements is required on the bandwidth and gain performance of the power amplifier, and the power amplifier needs to have higher bandwidth and a flat gain curve.

Due to the Miller effect of a power stage, the gain frequency characteristic and bandwidth of the conventional power amplifier are greatly affected, the gain curve is not flat, and the response of the high-bandwidth power amplifier to a large signal tends to be unstable, thereby limiting the bandwidth range.

SUMMARY OF THE INVENTION

Embodiment of the present invention mainly aim to provide a power amplifier and a method for amplifying a signal based on the power amplifier, so as to obtain higher bandwidth and stable gain performance of the power amplifier.

In order to achieve the objective, the embodiments of the present invention adopt the following technical solutions:

A power amplifier includes an operation amplifier stage, at least one buffer stage and an output stage which are consecutively connected with each other;

where the operation amplifier stage has two input ends, a positive input end is connected to a signal source, for receiving a signal to be amplified, and a negative input end receives a feedback signal;

a first feedback unit is connected between an output end of the output stage and a negative input end of the operation amplifier stage, and is configured to perform a closed-loop negative feedback on an output of the power amplifier;

a second feedback unit is connected between an input end of the output stage and the negative input end of the operation amplifier stage, and is configured to compensate phase lag caused by capacitance input by the input end of the output stage;

a third feedback unit is connected between an input end of the at least one buffer stage and the negative input end of the operation amplifier stage, and is configured to compensate phase lag caused by capacitance input by the input end of the buffer stage; and feedback signals provided by the first feedback unit, the second feedback unit and the third feedback unit are superposed at the negative input end of the operation amplifier stage.

A method for amplifying a signal based on a power amplifier includes:

superposing a first feedback signal obtained from an output end of an output stage, a second feedback signal obtained from an input end of the output stage and a third feedback signal obtained from an input end of a buffer stage, so as to form a total feedback signal; and coupling a signal to be amplified and the total feedback signal at an input end of an operation amplifier stage in a negative feedback manner, and performing amplification on the signal to be amplified under the compensation of the total feedback signal.

After the foregoing technical solution is adopted, in the power amplifier and the method for amplifying a signal based on the power amplifier provided in the embodiment of the present invention, feedback compensation is performed on equivalent load capacitance caused by the Miller effect, so that the influence of the Miller effect on the high-frequency characteristic of the power amplifier is eliminated effectively, and the power amplifier is enabled to obtain higher bandwidth and flat gain frequency characteristic.

BRIEF DESCRIPTION OF THE DRAWINGS

To illustrate the technical solutions in the embodiments of the present invention more clearly, the accompanying drawings for describing the embodiments are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

The technical solution of the present invention will be clearly and completely described in the following with reference to the accompanying drawings. Apparently, the embodiments to be described are only a part rather than all of the embodiments of the present invention. All other embodiments obtained by persons of ordinary skill in the art based on the embodiments of the present invention without creative efforts shall fall within the protection scope of the present invention.

An embodiment of the present invention aims to provide a power amplifier and a method for amplifying a signal based on a power amplifier, so as to provide a higher bandwidth and a stable gain performance.

Figure 1:
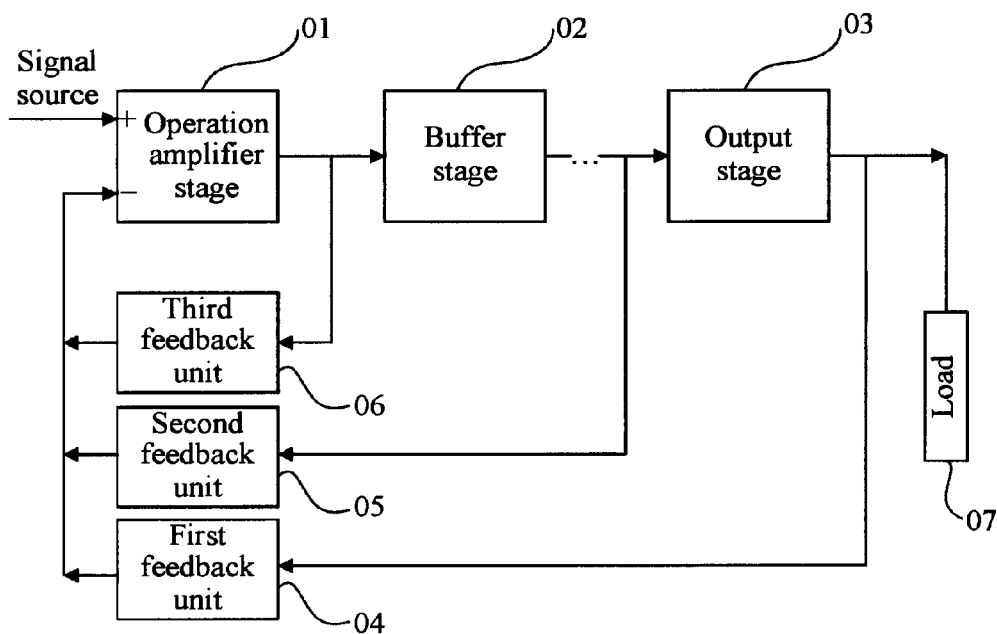
FIG. 1 is a system architecture diagram of a power amplifier according to an embodiment of the present invention.

A power amplifier provided in the embodiment of the present invention, as shown in FIG. 1, includes:

an operation amplifier stage 01, at least one buffer stage 02 and an output stage 03; where, the operation amplifier stage 01 has two input ends, a positive input end is connected to a signal source, for receiving a signal to be amplified, and a negative input end receives a feedback signal, for performing amplitude amplification;

a first feedback unit 04 is connected between an output end of the output stage 03 and a negative input end of the operation amplifier stage 01, and is configured to perform a closed-loop negative feedback on an output of the power amplifier, a second feedback unit 05 is connected between an input end of the output stage 03 and the negative input end of the operation amplifier stage 01, and is configured to compensate phase lag caused by capacitance input by the input end of the output stage 03;

a third feedback unit 06 is connected between an input end of the at least one buffer stage 02 and the negative input end of the operation amplifier stage 01, and is configured to compensate phase lag caused by capacitance input by the input end of the buffer stage 02; and feedback signals provided by the first feedback unit 04, the second feedback unit 05 and the third feedback unit 06 are superposed at the negative input end of the operation amplifier stage 01, so as to form a total feedback signal of the power amplifier.

Moreover, the output end of the output stage 03 is an output end of the power amplifier, and is connected to a load 07 during application.

In the power amplifier provided in the embodiment of the present invention, through the introduction of a feedback signal, feedback compensation is performed on equivalent load capacitance caused by the Miller effect, so that the influence of the Miller effect on the high-frequency characteristic of the power amplifier is eliminated effectively, and the power amplifier is enabled to obtain higher bandwidth and flat gain frequency characteristic. Meanwhile, the stability of the power amplifier system can be improved significantly.

Miller effect refers to that, in an electronic inverting amplifier, distribution capacitance or parasitic capacitance between an input and an output, due to the amplification function of the amplifier, has capacitance values equivalent to the input end being enlarged to 1+Av multiple, where Av is a voltage amplification multiple of the amplifier. Although, the Miller effect generally refers to the amplification of the capacitance, impedance between any input and other high amplifying sections may also be capable of changing input impedance of the amplifier through the Miller effect. For an amplifier adopting a metal oxide semiconductor field effect transistor (MOS transistor, Metal Oxide Semiconductor), the Miller effect enables the parasitic capacitance between a gate and a drain of the MOS transistor is much greater than the actual value, which brings in strong capacitance load effect. Especially, when the frequency is high enough, due to the influence of the Miller capacitance, a gain output voltage of the amplifier drops along with the frequency, that is, generates a response along with the frequency. Therefore, the Miller capacitance affects a lot in a high-frequency high-bandwidth power amplifier; the Miller capacitance limits the bandwidth of the amplifier, especially affects the large signal characteristic, and tends to enable a multi-stage amplifier to be unstable. Based on this, in the embodiment of the present invention, through the introduction of the feedback signal, the feedback compensation is performed on equivalent load capacitance caused by the Miller effect, thereby effectively reducing the high-frequency output impedance of the buffer stage 02, improving the overall effective bandwidth of the power amplifier, especially the large signal characteristic, and effectively eliminating the influence of the Miller effect on the power amplifier.

The first feedback unit 04 is a phase lag feedback unit, and is specifically an apparatus or a circuit that is capable of implementing a phase lag feedback function. A feedback loop thereof closes the loop of the whole power amplifier, samples the output end of the power amplifier, and provides a first feedback signal, where the sampled first feedback signal is capable of improving the stability of the gain of the power amplifier, and expanding the bandwidth of the power amplifier.

The second feedback unit 05 is a phase lead feedback unit, and is specifically an apparatus or a circuit that is capable of implementing a phase lead feedback function, samples the input end of the output stage 03, and provides a second feedback signal, where the sampled second feedback signal provides compensation for the phase loss caused by Miller load capacitance of the output stage 03, thereby improving the stability of the system, expanding the bandwidth of the power amplifier, and enabling a linear power amplifier to provide a relatively flat frequency response characteristic.

The third feedback unit 06 is a phase lead feedback unit, and is specifically an apparatus or a circuit that is capable of implementing a phase lead feedback function, samples the input end of the at least one buffer stage 02, and provides a third feedback signal, where the sampled third feedback signal provides compensation for the phase loss caused by Miller capacitance of the buffer 02, thereby improving the stability of the system.

The power amplifier provided in the embodiment of the present invention may be applied in such an occasion as a base station that needs to provide a following voltage, and in a power amplifying device that needs to provide higher bandwidth and stable gain performance.

In order to make persons skilled in the art understand the technical solution of the embodiments of the present invention better, the power amplifier provided in the embodiment of the present invention is described in detail below through a specific embodiment.

Embodiment 1

Figure 2:
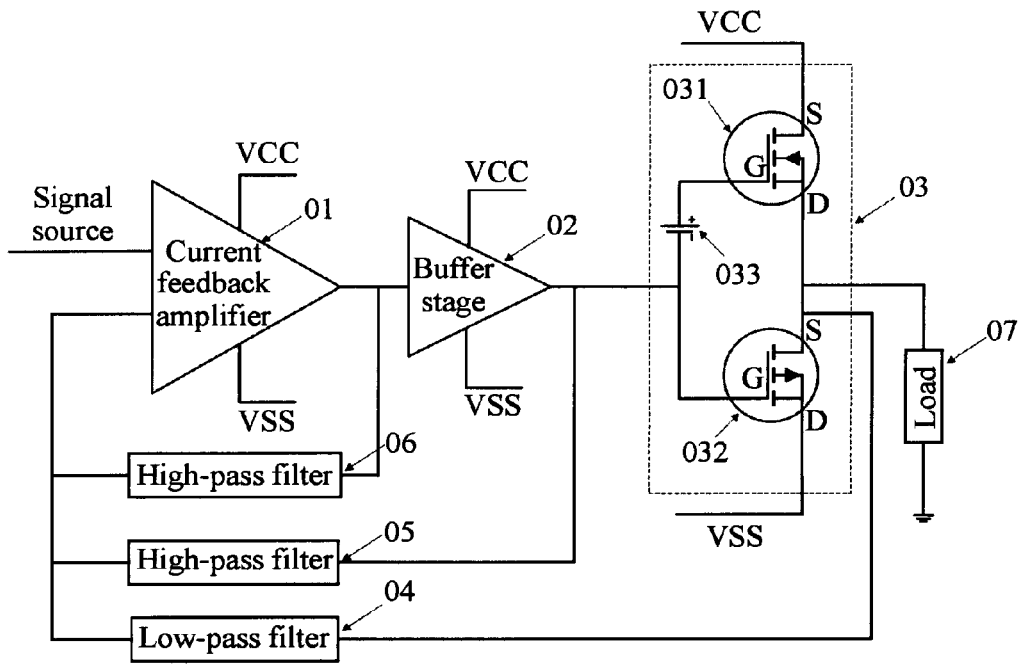
FIG. 2 is a schematic diagram of a circuit according to Embodiment 1 of the present invention.

As shown in FIG. 2, a power amplifier of this embodiment includes an operation amplifier stage 01, a buffer stage 02, and an output stage 03 which are consecutively connected with each other, and further includes a first feedback unit 04, a second feedback unit 05 and a third feedback unit 06, where feedback signals provided by the three feedback units are superposed at a negative input end of the operation amplifier stage 01, so as to form a feedback signal of the whole power amplifier.

The operation amplifier stage 01 adopts a CFA (Current Feedback Amplifier, current feedback amplifier). The gain and bandwidth of the CFA have small influence with each other, so as to implement faster slew rate and lower distortion; a positive input end of the CFA 01 is connected to an input signal source, serves as an input end of the whole power amplifier, and receives a signal to be amplified; a negative input end is connected to output ends of the first feedback unit 04, the second feedback unit 05 and the third feedback unit 06, and receives feedback signals sampled by the three feedback units; and an output end of the CFA 01 is coupled to the input end of the buffer stage 02.

The buffer stage 02 adopts a conventional integrated buffer, such as a symmetric AB type emitter follower, provides power amplification between the operation amplifier stage 01 and the output stage 03, and meanwhile, provides this embodiment with a push current and a pull current, and provides a lower output impedance relative to the load during positive and negative output. The output end of the buffer stage 02 is coupled to the input end of the output stage 03; it should be noted that, the buffer stage 02 may also select another conventional integrated buffer, and the selection is made according to an actual situation.

The output stage 03 is formed by a symmetric AB type source follower, and includes an NMOS (N-channel Metal Oxide Semiconductor, N channel MOS) 031, a PMOS (P-channel Metal Oxide Semiconductor, P channel MOS) 032, and a bias voltage source 033.

A drain D of the NMOS 031 is coupled to a source S of the PMOS transistor 032, serves as the output end of the whole power amplifier, and is connected to the load 07 during use; the source S of the NMOS 031 is connected to an anode VCC of the power supply source; a drain of the PMOS 032 is grounded or connected to a cathode VSS of the power supply source; an anode of the bias voltage source 033 is connected to a gate G of the NMOS, and a cathode is connected to a gate G of the PMOS, so as to provide a gate bias voltage greater than a threshold voltage for the NMOS 031 and the PMOS 032, so that the two MOS transistors work in a saturation area; and the gate G of the PMOS transistor 032 serves as the input end of the output stage 03.

Figure 3:
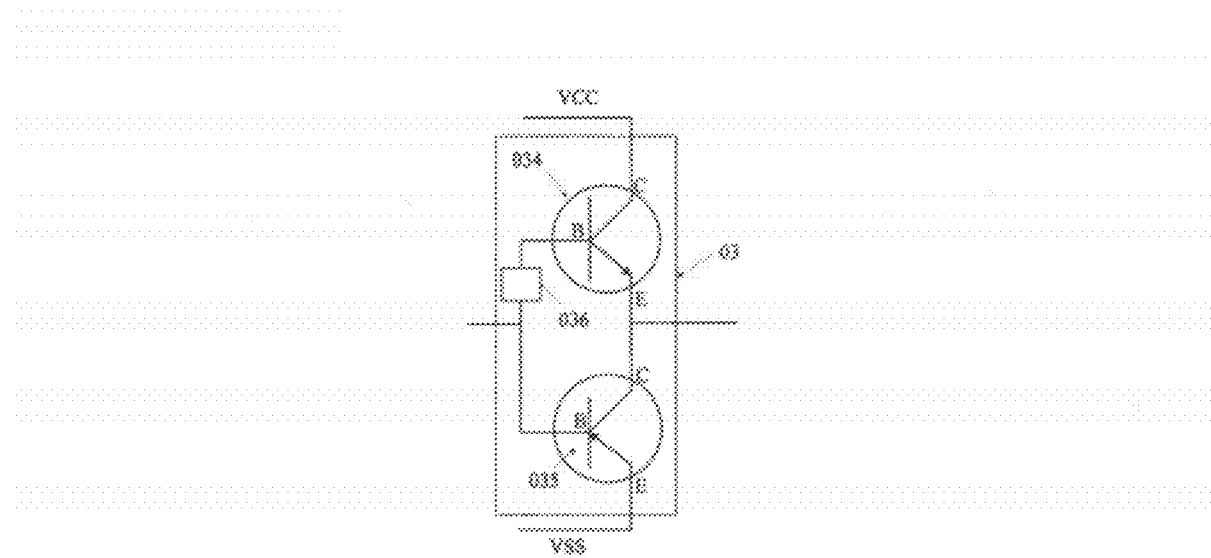
FIG. 3 is a schematic diagram of another circuit of an output stage according to Embodiment 1 of the present invention.

Here, it should be noted that, the NMOS 031 of the output stage 03 may be replaced by an NPN (Negative-Positive-Negative, negative-positive-negative) type transistor; the PMOS 032 may be replaced by a PNP (Positive-Negative-Positive, positive-negative-positive) type transistor; and a specific connection manner is shown in FIG. 3. An emitter E of the NPN type transistor 034 is coupled to a collector C of the PNP type transistor 035, so as to serve as the output end of the power amplifier; a collector C of the NPN type transistor 034 is connected to the anode VCC of the power supply source; an emitter E of the PNP type transistor 035 is grounded or is connected to the cathode VSS of the power supply source; a base B of the PNP type transistor 035 serves as the input end of the output stage 03; and the bias circuit 036 is configured to provide a bias current for the NPN type transistor and the PNP type transistor.

VCC shown in FIG. 2 and FIG. 3 represents a power supply source voltage, and VSS represents the ground or the cathode of the power supply source voltage.

As shown in FIG. 2, the first feedback unit 04 in this embodiment may be an LPF (Low-Pass Filter, low-pass filter) implementing a phase lag feedback function. A feedback loop of the LPF 04 closes the loop of the whole power amplifier, and input end thereof is connected to the output end of the output stage 03, that is the output end of the power amplifier in this embodiment. An output end is connected to the negative input end of the operation amplifier stage 01, samples the output end of the power amplifier, and provides a first feedback signal for the operation amplifier stage 01, where the sampled first feedback signal is capable of improving the stability of the gain of the power amplifier, and expanding the bandwidth of the power amplifier.

In this embodiment, the second feedback unit 05 may be an HPF (High-Pass Filter, high-pass filter) implementing a phase lead feedback function. An input end of the HPF 05 is connected to the output end of the buffer stage 02, that is, the input end of the output stage 03. An output end is connected to the negative input end of the output amplifier stage 01, samples the input end of the output stage 03, and provides a second feedback signal for the operation amplifier stage 01, where the sampled second feedback signal provides compensation for the phase loss caused by Miller capacitance of the output stage 03, thereby improving the stability of the system, expanding the bandwidth of the power amplifier, and enabling a linear power amplifier to provide a relatively flat frequency response characteristic.

In this embodiment, the third feedback unit 06 may be an HPF implementing a phase lead feedback function. An input end of the HPF 06 is connected to the output end of the operation amplifier stage 01, that is, the input end of the buffer stage 02. An output end is connected to the negative input end of the operation amplifier stage 01, samples the input end of the buffer stage 02, and provides a third feedback signal for the amplifier stage 01, where the sampled third feedback signal provides compensation for the phase loss caused by Miller capacitance of the buffer 02, thereby improving the stability of the system.

The first feedback signal, the second feedback signal, and the third feedback signal are superposed at the negative input end of the operation amplifier stage, so as to form a feedback signal of the whole power amplifier.

The power amplifier in this embodiment performs feedback compensation on the Miller capacitance of the buffer stage 02 and the output stage 03, so that the influence of the Miller effect on the high-frequency characteristic of the power amplifier is eliminated effectively, and the power amplifier is enabled to provide higher bandwidth and flat gain performance. Meanwhile, the stability of the system of the power amplifier can be improved.

Figure 4:
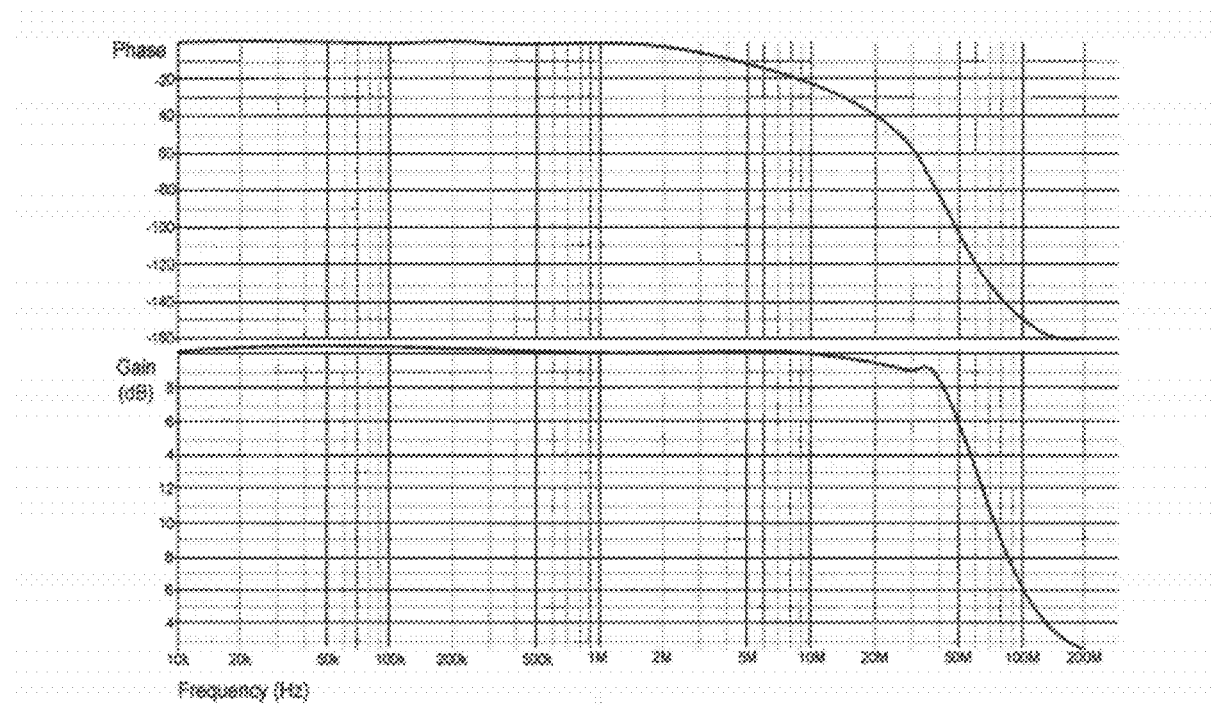
FIG. 4 is a frequency response curve according to Embodiment 1 of the present invention.

FIG. 4 is a frequency response curve of a power amplifier of this embodiment. As shown in FIG. 4, the gain curve of the power amplifier of this embodiment is relatively flat, has relatively stable response for a large signal, and can keep relatively flat gain curve and phase response for high-frequency signals of about 50 MHz, thereby effectively improving the bandwidth of the power amplifier.

Figure 5:
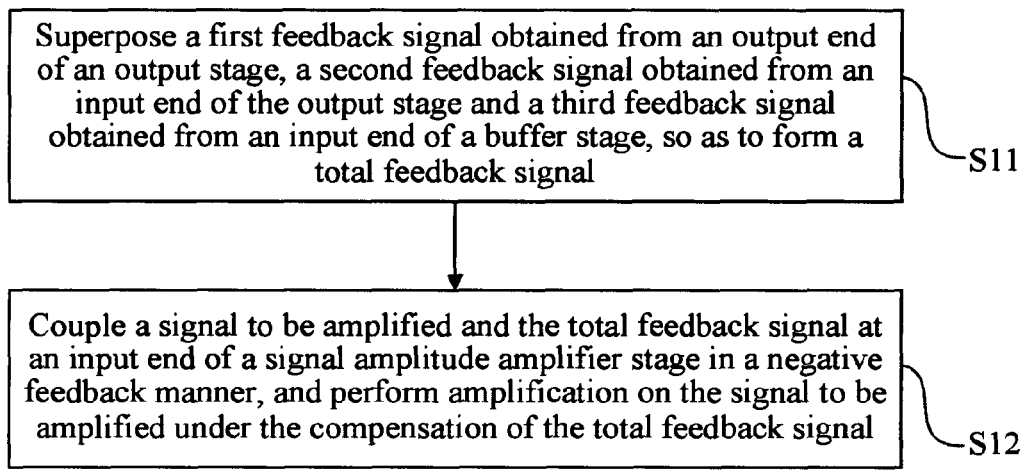
FIG. 5 is a flow chart of a method for amplifying a signal based on a power amplifier according to an embodiment of the present invention.

Accordingly, the embodiment of the present invention further provides a method for amplifying a signal based on a power amplifier, as shown in the flow chart of FIG. 5, which includes the following steps:

S11: Superpose a first feedback signal obtained from an output end of an output stage, a second feedback signal obtained from an input end of the output stage and a third feedback signal obtained from an input end of a buffer stage, so as to form a total feedback signal.

S12: Couple a signal to be amplified and the total feedback signal at an input end of an operation amplifier stage in a negative feedback manner, and perform amplification on the signal to be amplified under the compensation of the total feedback signal.

It should be noted that, in the method for amplifying a signal based on the power amplifier provided in the embodiment of the present invention, the power amplifier adopts multi-stage architecture where an operation amplifier stage, a buffer stage and an output stage are connected sequentially.

In the S11 step, the first feedback signal is a signal of the output end of the output stage fed back by a phase lag feedback unit to the input end of the operation amplifier stage, and provides phase lag feedback, thereby improving the stability of the gain of the power amplifier, and expanding the bandwidth of the power amplifier.

The second feedback signal is a signal of the input end of the output stage fed back by a phase lead feedback unit to the input end of the operation amplifier stage, provides compensation for the phase loss caused by Miller capacitance of the output stage, thereby improving the stability of the system, expanding the bandwidth of the power amplifier, and enabling a linear power amplifier to provide a relatively flat frequency response characteristic.

The third feedback signal is a signal of the input end of the buffer stage fed back by a phase lead feedback unit to the input end of the operation amplifier stage, and the sampled third feedback signal provides compensation for the phase loss caused by Miller capacitance of the buffer, thereby improving the stability of the system.

The feedback signals are superposed at the negative input end of the operation amplifier stage, so as to form a total feedback signal of the power amplifier; and the power amplifier receives a signal to be amplified via a positive input end of the operation amplifier stage, and receives the total feedback signal via a negative input end, so as to form a negative feedback.

In the method for amplifying a signal based on the power amplifier provided in the embodiment of the present invention, feedback compensation is performed on equivalent load capacitance caused by the Miller effect, so that the influence of the Miller effect on the high-frequency characteristic of the power amplifier is eliminated effectively, and the power amplifier is enabled to obtain higher bandwidth and stable gain performance.

The foregoing descriptions are merely specific embodiments of the present invention, but not intended to limit the present invention. All variations or substitutions that can be easily figured out by persons skilled in the art within the technical scope of the present invention should fall within the protection scope of the present invention. Therefore, the protection scope of the present invention is subject to the appended claims.

What is claimed is:

1. A power amplifier, comprising:
an operation amplifier stage, at least one buffer stage and an output stage which are consecutively connected with each other;
wherein the operation amplifier stage has a positive input end connected to a signal source, for receiving a signal to be amplified, and a negative input end for receiving a feedback signal;
a first feedback unit connected between an output end of the output stage and the negative input end of the operation amplifier stage, and configured to provide a first feedback signal to perform a closed-loop negative feedback on an output of the power amplifier;
a second feedback unit connected between an input end of the output stage and the negative input end of the operation amplifier stage, and configured to provide a second feedback signal to compensate phase lag caused by capacitance input by the input end of the output stage; and
a third feedback unit connected between an input end of the at least one buffer stage and the negative input end of the operation amplifier stage, and configured to provide a third feedback signal to compensate phase lag caused by capacitance input by the input end of the buffer stage;
the first, second and third feedback signals respectively provided by the first feedback unit, the second feedback unit and the third feedback unit are superposed at the negative input end of the operation amplifier stage.

2. The power amplifier according to claim 1, wherein,
the first feedback unit includes a phase lag feedback unit;
the second feedback unit includes a phase lead feedback unit; and
the third feedback unit includes a phase lead feedback unit.

3. The power amplifier according to claim 2, wherein,
the first feedback unit includes a low-pass filter;
the second feedback unit includes a high-pass filter; and
the third feedback unit includes a high-pass filter.

4. The power amplifier according to claim 2, wherein, the operation amplifier stage is a current feedback amplifier; the positive input end of the current feedback amplifier is connected to a signal source, for receiving a signal to be amplified; and the negative input end receives a feedback signal; and feedback signals provided by the first feedback unit, the second feedback unit and the third feedback unit are superposed.

5. The power amplifier according to claim 1, wherein, the output stage comprises an N-type metal oxide semiconductor field effect transistor (NMOS), a P-type metal oxide semiconductor field effect transistor (PMOS), and a bias voltage source;
wherein, a drain of the NMOS and a source of the PMOS transistor are coupled and connected to serve as an output end of the power amplifier;
a source of the NMOS is connected to an anode of a power supply source;
a drain of the PMOS is grounded or connected to a cathode of the power supply source; and
an anode of the bias voltage source is connected to a gate of the NMOS; and a cathode is connected to a gate of the PMOS, for providing a gate bias voltage for the NMOS transistor and the PMOS transistor.

6. The power amplifier according to claim 1 wherein, the output stage comprises a negative-positive-negative NPN type transistor, a positive-negative-positive PNP type transistor, and a bias circuit;
wherein, an emitter of the NPN type transistor and a collector of the PNP type transistor are coupled and connected to serve as the output end of the power amplifier;
a collector of the NPN type transistor is connected to an anode of the power supply source;
an emitter of the PNP type transistor is grounded or connected to a cathode of the power supply source;
a base of the PNP type transistor is served as the input end of the output stage; and
the bias circuit is configured to provide a bias current for the NPN type transistor and the PNP type transistor.

7. A method for amplifying a signal based on a power amplifier, comprising:
superposing a first feedback signal obtained from an output end of an output stage to perform a closed-loop negative feedback on an output of the power amplifier, a second feedback signal obtained from an input end of the output stage to compensate phase lag caused by capacitance input by the input end of the output stage, and a third feedback signal obtained from an input end of a buffer stage to compensate phase lag caused by capacitance input by the input end of the buffer stage, so as to form a total feedback signal; and
coupling a signal to be amplified and the total feedback signal at an input end of an operation amplifier stage in a negative feedback manner, and performing amplification on the signal to be amplified under the compensation of the total feedback signal.

8. The method for amplifying a signal according to claim 7, wherein,
the first feedback signal is a signal of the output end of the output stage fed back by a phase lag feedback unit to the input end of the operation amplifier stage;

the second feedback signal is a signal of the input end of the output stage fed back by a phase lead feedback unit to the input end of the operation amplifier stage; and
the third feedback signal is a signal of the input end of the buffer stage fed back by a phase lead feedback unit to the input end of the operation amplifier stage.

\* \* \* \* \*